(12) United States Patent
Takizawa

(10) Patent No.: US 11,587,879 B2
(45) Date of Patent: Feb. 21, 2023

(54) ELECTRONIC APPARATUS AND MANUFACTURING METHOD THEREOF

(71) Applicant: FUJI ELECTRIC CO., LTD., Kawasaki (JP)

(72) Inventor: Naoki Takizawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 174 days.

(21) Appl. No.: 17/141,922

(22) Filed: Jan. 5, 2021

(65) Prior Publication Data
US 2021/0233855 A1  Jul. 29, 2021

(30) Foreign Application Priority Data

Jan. 23, 2020 (JP) .............................. JP2020-009066
Sep. 17, 2020 (JP) .............................. JP2020-156554

(51) Int. Cl.
*H01L 23/52* (2006.01)
*H01L 23/538* (2006.01)
(Continued)

(52) U.S. Cl.
CPC ...... *H01L 23/5385* (2013.01); *H01L 21/4871* (2013.01); *H01L 21/50* (2013.01); *H01L 23/3735* (2013.01); *H01L 23/53228* (2013.01); *H01L 23/564* (2013.01); *H01L 24/95* (2013.01); *H01L 25/0655* (2013.01); *H05K 1/0306* (2013.01); *H01L 2021/60135* (2013.01); *H05K 3/244* (2013.01)

(58) Field of Classification Search
CPC . H01L 21/4871; H01L 21/50; H01L 23/3735; H01L 23/564; H01L 24/95; H01L 25/0655; H05K 1/0306; H05K 3/244
See application file for complete search history.

(56) References Cited

U.S. PATENT DOCUMENTS 10,937,727 B2 * 3/2021 Nishida ............... H01L 21/4853
2003/0211407 A1 * 11/2003 Watanabe ............. G03F 7/0233
528/10
(Continued)

FOREIGN PATENT DOCUMENTS

EP         2669938 A2   12/2013
JP      H08-031848 A    2/1996
(Continued)

*Primary Examiner* — Nicholas J Tobergte
(74) *Attorney, Agent, or Firm* — Rabin & Berdo, P.C.

(57) ABSTRACT

An electronic device includes a first part, and a circuit plate including a circuit substrate, a plating film made of a plating material and being disposed on a front surface of the substrate. The plating film includes a first part region on which the first part is disposed via a first solder, and a liquid-repellent region extending along a periphery side of the first part region in a surface layer of the plating film, and having a liquid repellency greater than a liquid repellency of the plating film. The liquid-repellent region includes a resist region. The plating film includes a remaining portion between the liquid-repellent region and the front surface of the circuit substrate in a thickness direction of the plating film orthogonal to the front surface. The remaining portion is made of the plating material and is free of the oxidized plating material.

20 Claims, 14 Drawing Sheets

(51) Int. Cl.
  *H01L 21/50*   (2006.01)
  *H01L 23/532*  (2006.01)
  *H01L 23/00*   (2006.01)
  *H01L 25/065*  (2023.01)
  *H01L 21/48*   (2006.01)
  *H01L 23/373*  (2006.01)
  *H05K 1/03*    (2006.01)
  H01L 21/60     (2006.01)
  H05K 3/24      (2006.01)

(56) References Cited

U.S. PATENT DOCUMENTS

| | | | |
|---|---|---|---|
| 2005/0158665 A1* | 7/2005 | Maekawa | G02B 5/201 |
| | | | 257/E21.414 |
| 2006/0186520 A1* | 8/2006 | Toba | H01L 23/373 |
| | | | 257/E23.106 |
| 2013/0313711 A1 | 11/2013 | Kumagai et al. | |
| 2015/0187671 A1 | 7/2015 | Fukuda et al. | |
| 2016/0276249 A1 | 9/2016 | Okada | |
| 2022/0122920 A1* | 4/2022 | Terashima | H01L 23/49844 |

FOREIGN PATENT DOCUMENTS

| | | |
|---|---|---|
| JP | 2006216729 A | 8/2006 |
| JP | 2008177383 A | 7/2008 |
| JP | 2009218260 A | 9/2009 |
| JP | 2010212723 A | 9/2010 |
| JP | 2013247256 A | 12/2013 |
| JP | 2016029676 A | 3/2016 |
| JP | 2016174053 A | 9/2016 |
| JP | 2017005149 A | 1/2017 |

\* cited by examiner

ELECTRONIC APPARATUS AND MANUFACTURING METHOD THEREOF

CROSS-REFERENCE TO RELATED APPLICATIONS

This application is based upon and claims the benefits of priority of the prior Japanese Patent Application No. 2020-009066, filed on Jan. 23, 2020, and the Japanese Patent Application No. 2020-156554, filed on Sep. 17, 2020, the entire contents of which are incorporated herein by reference.

BACKGROUND OF THE INVENTION

1. Field of the Invention

The embodiment discussed herein relates to an electronic apparatus including a board and parts soldered thereto and a manufacturing method of the electronic apparatus.

2. Background of the Related Art

A semiconductor device, which is an example of an electronic device, includes power devices and is used as a power conversion device. The power devices are, for example, semiconductor chips including insulated gate bipolar transistors (IGBTs) or power metal-oxide-semiconductor field-effect transistors (MOSFETs). The semiconductor device includes the semiconductor chips and a ceramic circuit board on which the semiconductor chips are disposed via solder. The ceramic circuit board includes an insulating plate and a plurality of circuit plates formed on the insulating plate. The individual one of the semiconductor chips is disposed on a corresponding one of the plurality of circuit plates via solder. There are also cases in which the circuit plates include slits around part regions in which the semiconductor chips are formed. These slits are used for positioning the semiconductor chips and preventing the solder from spreading.

In the case of the semiconductor device, the semiconductor chips are disposed on the corresponding circuit plates on the ceramic circuit board via solder, and the solder is melted and solidified. As a result, the semiconductor chips are firmly attached to the circuit plates. However, the melted solder flows to the outside of the part regions of the semiconductor chips. The solder could also flow over the slits. Therefore, various techniques have been proposed to prevent this solder flowage. For example, a solder leakage prevention part formed of a linear oxide is formed along a semiconductor chip on a circuit plate (see, for example, Japanese Laid-open Patent Publication No. 2013-247256). In addition, a front surface of a circuit plate is plated, a portion on which solder is not wettable is formed around a part region of a semiconductor chip on the plated surface (see, for example, Japanese Laid-open Patent Publication No. 2008-177383). In addition, on copper film on an insulating board, oxidized copper film is formed on an area in which no semiconductor chip is disposed (see, for example, Japanese Laid-open Patent Publication No. 08-031848). In addition, a first area is formed around a semiconductor chip bonded by solder on a surface where a member is mounted. A second area whose wettability to solder is lower than that of the first area is also formed (see, for example, Japanese Laid-open Patent Publication No. 2009-218280). In addition, even when a ceramic circuit board is disposed on a metal base plate via solder, dam material is formed around a part region of the ceramic circuit board (see, for example, Japanese Laid-open Patent Publication No. 2010-212723 and Japanese Laid-open Patent Publication No. 2006-216729). In addition, a separation layer is formed around a part region in which a semiconductor chip is mounted via solder (see, for example, Japanese Laid-open Patent Publication No. 2016-174053). In addition, laser irradiation is performed around a semiconductor chip. In this way, a groove part is formed around the semiconductor chip, and an oxidized area is generated on either side of the groove part. The wall surfaces of the groove part are formed of an oxidized base board and part of oxidized plating material (see, for example, Japanese Laid-open Patent Publication No. 2017-005149).

The semiconductor chips and the ceramic circuit board of such a semiconductor device as described above are sealed with sealing material. In the case of the semiconductor device, to improve the adhesion between the sealing material and the ceramic circuit board, an anchor layer formed by a streaky concave part is formed around an individual semiconductor chip on a circuit plate (for example, see Japanese Laid-open Patent Publication No. 2016-029676).

Recent years have seen a demand for downsizing or more capacity for semiconductor devices. In addition, along with improvement in the packaging density of the semiconductor chips, the gap between semiconductor chips has been decreased. Thus, it is becoming more difficult to form material for limiting the leakage of solder between semiconductor chips. When the solder under semiconductor chips is melted, the semiconductor chips are more likely to be coupled to each other, and a contact failure of the semiconductor chips is more likely to occur. Thus, the reliability of the semiconductor device is deteriorated.

SUMMARY OF THE INVENTION

According to an aspect of the embodiment, there is provided an electronic apparatus including: a first part; and a circuit plate including a circuit substrate having a front surface, a plating film made of a plating material, and being disposed on the front surface of the circuit substrate, the plating film having a first surface and a second surface opposite to the first surface and facing the front surface of the circuit substrate, the plating film including a first part region at its first surface, the first part being disposed on the first part region via a first solder, and a liquid-repellent region disposed to extend in an extending direction along a periphery side of the first part region in a surface layer of the plating film at a first surface side thereof, and having a liquid repellency greater than a liquid repellency of the plating film, the liquid-repellent region including a resist region, wherein the plating film includes a remaining portion between the liquid-repellent region and the front surface of the circuit substrate in a thickness direction of the plating film orthogonal to the front surface of the circuit substrate, the remaining portion being made of the plating material and being free of the oxidized plating material.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
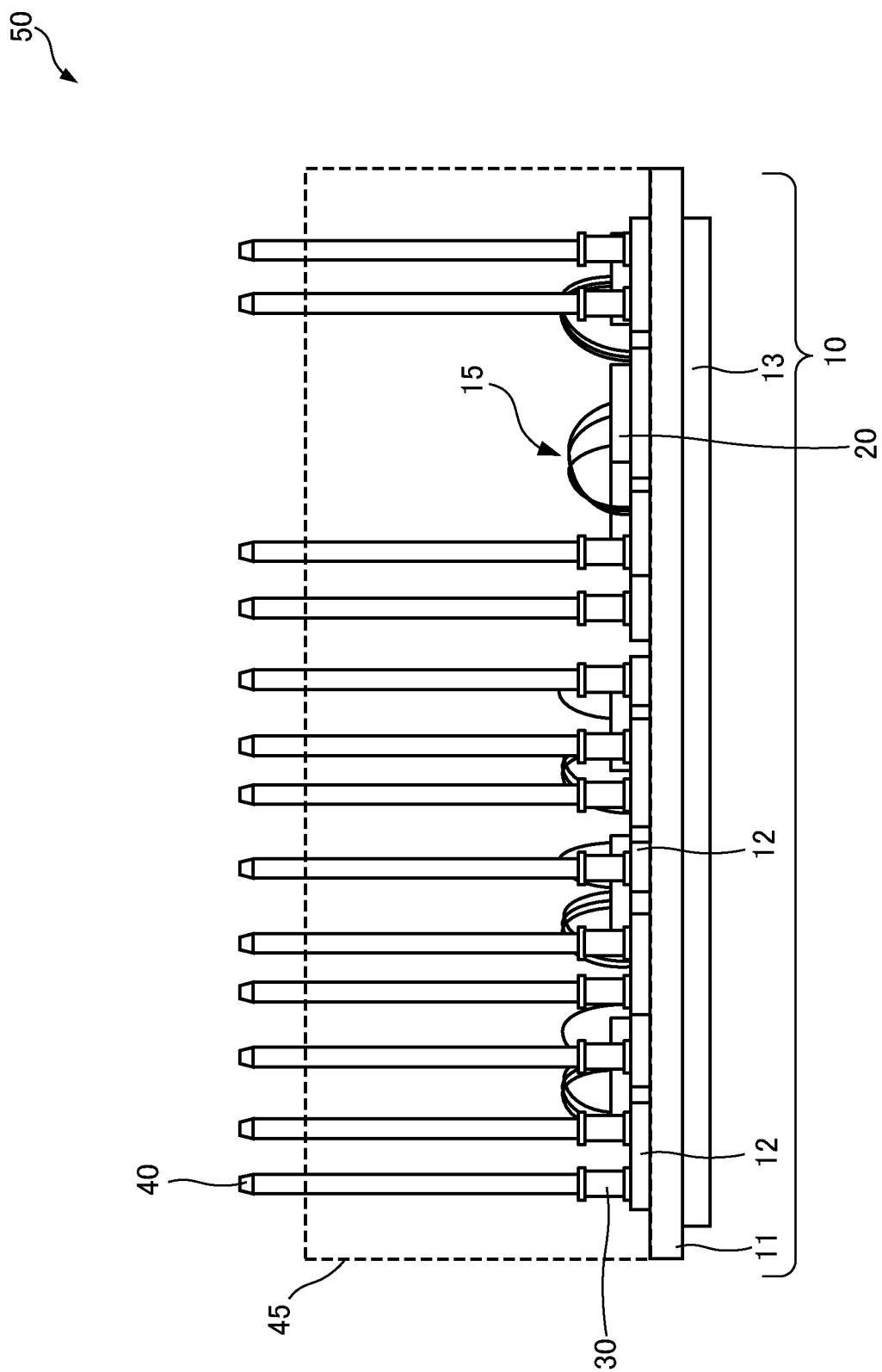
FIG. 1 is a side view of an electronic device according to an embodiment.

Hereinafter, an embodiment will be described with reference to the accompanying drawings. In the following description, regarding an electronic device 50 in FIG. 1, terms "front surface" and "top surface" each mean a surface facing upwards. Likewise, regarding the electronic device 50 in FIG. 1, a term "up" means an upward direction. In addition, regarding the electronic device 50 in FIG. 1, terms "rear surface" and "bottom surface" each mean a surface facing downwards. Likewise, regarding the electronic device 50 in FIG. 1, a term "down" means a downward direction. In the drawings other than FIG. 1, the above terms mean their respective directions, as needed. The terms "front surface", "top surface", "up", "rear surface", "bottom surface", "down", and "side surface" are only expressions used for the purpose of convenience to determine a relative positional relationship and do not limit the technical concept of the embodiment. For example, the terms "up" and "down" do not necessarily mean a vertical direction with respect to the ground. Namely, the directions expressed by "up" and "down" are not limited to the directions relating to the gravity.

Figure 2:
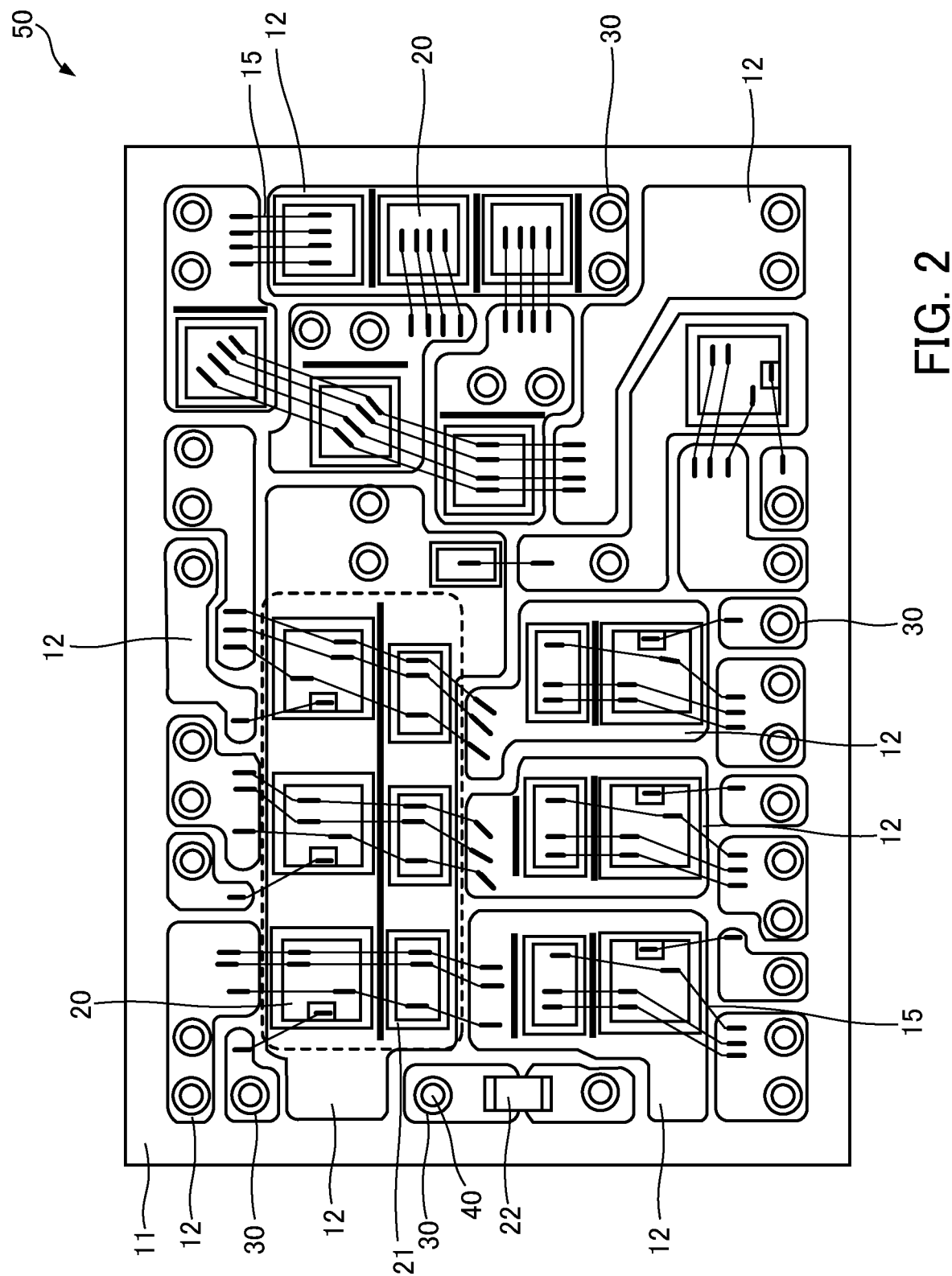
FIG. 2 is a plan view of the electronic device according to the embodiment.

The electronic device 50 according to the embodiment will be described with reference to FIGS. 1 and 2. FIG. 1 is a side view of the electronic device 50 according to the embodiment, and FIG. 2 is a plan view of the electronic device 50 according to the embodiment. The present embodiment will be described by using an example in which a semiconductor device is used as the electronic device 50. In addition, sealing material 45 is denoted by a dashed line in FIG. 1, and illustration of the sealing material 45 is omitted in FIG. 2. In addition, while this electronic device 50 includes a case that houses a ceramic circuit board 10, etc., the description of the case will be omitted. In the present embodiment, a plurality of circuit plates will each be denoted by reference numeral 12, and a plurality of semiconductor chips will each be denoted by reference numeral 20 or 21. A plurality of contact parts will each be denoted by reference numeral 30, and a plurality of bonding wires will each be denoted by reference numeral 15. A plurality of external connection terminals will each be denoted by reference numeral 40. In addition, an individual kind of elements will also be denoted by a single reference numeral.

As illustrated in FIGS. 1 and 2, the electronic device 50 includes the ceramic circuit board 10 and the semiconductor chips 20 and 21 bonded to the front surface of the ceramic circuit board 10. The electronic device 50 includes the contact parts 30 bonded to the front surface of the ceramic circuit board 10. The semiconductor chips 20 and 21 and the contact parts 30 are bonded to the front surface of the ceramic circuit board 10 via solder (not illustrated) used as bonding material. In addition, the electronic device includes the bonding wires 15 that electrically connect the front surface of the ceramic circuit board 10 and main electrodes of the semiconductor chips 20 and 21. In addition, the external connection terminals 40 are pressed into the contact parts 30. The electronic device 50, including the semiconductor chips 20 and 21 bonded to the front surface of the ceramic circuit board 10, is sealed with the sealing material 45 such that tip parts of the external connection terminals 40 attached to the contact parts 30 protrude from the sealing material 45.

The ceramic circuit board 10 includes an insulating plate 11, the plurality of circuit plates 12 formed on the front surface of the insulating plate 11, and a metal plate 13 formed on the rear surface of the insulating plate 11. For example, the insulating plate 11 is made of ceramic material having excellent thermal conductivity. Examples of this ceramic material include aluminum oxide, aluminum nitride, and silicon nitride. The thickness of the insulating plate 11 is between 0.5 mm and 2.0 mm, inclusive. The plurality of circuit plates 12 each include a base material made of material having excellent electrical conductivity. The material is, for example, copper or a copper alloy. In addition, to improve the corrosion resistance, plating film 12a (see FIG. 4) is formed on the front surface of the circuit plates 12 by plate processing. The plating film is made of a plating material such as nickel or a nickel alloy. A nickel-phosphorus alloy or a nickel-boron alloy is preferably used as the nickel alloy. The metal plate 13 is made of metal material having excellent thermal conductivity. Examples of the metal material include aluminum, iron, silver, copper, and an alloy containing at least one kind of these elements. The thickness of the metal plate 13 is between 0.1 mm and 2.0 mm, inclusive. To improve the corrosion resistance, plating film may be formed on the front surface of the metal plate 13 by plate processing. The plating film is made of nickel, a nickel-phosphorus alloy, or a nickel-boron alloy, for example. In addition, a cooling module (not illustrated) may be attached to the rear surface of the metal plate 13. The insulating plate 11 has a rectangular shape in a planar view, for example. The metal plate 13 also has a rectangular shape whose area is smaller than that of the insulating plate 11 and larger than the total area of the circuit plates 12 in a planar view. Thus, the ceramic circuit board 10 has a rectangular shape, for example.

Liquid-repellent parts 14 are formed at appropriate locations on the circuit plates 12. A liquid-repellent part 14 is formed between part regions where semiconductor chips 20 and 21 on a circuit plate 12 are disposed. In addition, a liquid-repellent part 14 is formed between a semiconductor chip 20 and a contact part 30 (an external connection terminal 40). In addition, a liquid-repellent part 14 is formed between a semiconductor chip 21 and an end part (an area to which a bonding wire 15 is bonded) of a circuit plate 12. Such a liquid-repellent part 14 is formed to extend in the longitudinal or transverse direction of the ceramic circuit board 10. The above locations and directions in which the liquid-repellent parts 14 are formed are only examples. The liquid-repellent parts may be formed at any locations and in any directions, depending on the need. The liquid-repellent parts 14 will be described in detail below.

For example, a direct copper bonding (DCB) board or an active metal brazed (AMB) board may be used as the ceramic circuit board 10 having the above configuration. A cooling module (not illustrated) may be attached to the rear surface of the metal plate 13 of the ceramic circuit board 10 via thermal conduction interface material. In this way, the heat radiation performance of the electronic device 50 is further improved. Examples of the thermal conduction interface material include thermal grease, solder, and silver solder. The thermal grease is silicone in which metal oxide filler is mixed, for example. The cooling module includes metal material having excellent thermal conductivity. Examples of the metal material include aluminum, iron, silver, copper, and an alloy containing at least one kind of these elements. The cooling module includes a heatsink having at least one fin and is a cooling device using liquid refrigerant, for example.

An individual semiconductor chip 20 includes a switching element made of silicon or silicon carbide. For example, the switching element is an IGBT or a power MOSFET. The individual semiconductor chip 20 has a rectangular shape in a planar view and has, for example, a drain electrode (or a collector electrode) on its rear surface as a main electrode. In addition, the individual semiconductor chip 20 has a control electrode and a gate electrode and a source electrode (or an emitter electrode) as main electrodes on its front surface. The gate electrode is disposed in a center part along a short side on the front surface of the semiconductor chip 20. An individual semiconductor chip 21 includes a diode, which is a freewheeling diode (FWD) such as a Schottky barrier diode (SBD) or a P-intrinsic-N (PiN) diode. The individual semiconductor chip 21 has a cathode electrode on its rear surface as a main electrode and an anode electrode on its front surface as a main electrode. The rear surfaces of the above semiconductor chips 20 and 21 are bonded to predetermined circuit plates (not illustrated). The semiconductor chips 20 and 21 are bonded to the circuit plates 12 via solder (not illustrated). The solder will be described below. In addition, while not illustrated, a reverse-conducting (RC)-IGBT having both functions of an IGBT and an FWD may be used in place of a combination of semiconductor chips 20 and 21. In addition, an electronic part 22 is disposed over a pair of circuit plates 12. The electronic part 22 is, for example, a thermistor or a current sensor. The thickness of each of the semiconductor chips 20 and 21 is, for example, between 180 μm and 220 μm, inclusive. The average of the thickness is approximately 200 μm.

A bonding wire 15 electrically connects a semiconductor chip 20 or 21 and a circuit plate 12. Another bonding wire 15 electrically connects a plurality of semiconductor chips 20 and 21, as needed. These bonding wires 15 are made of material having excellent electrical conductivity. Examples of the material include gold, silver, copper, aluminum, and an alloy containing at least one kind of these elements. In addition, the diameter of a bonding wire 15 through which a control current flows is, for example, between 110 μm and 200 μm, inclusive. The diameter of a bonding wire 15 through which a main current flows may be, for example, between 350 μm and 600 μm, inclusive.

An individual contact part 30 has a main body part including a cylindrical through-hole and a flange at either opening part of the main body part. This through-hole may be shaped in a cylinder or a polygonal prism. The individual contact part 30 is made of metal material having excellent electrical conductivity. Examples of the material include silver, copper, nickel, and an alloy containing at least one kind of these elements. To improve the corrosion resistance, plating film may be formed on the surface of the individual contact part 30 by plate processing. The plating film is made of nickel, a nickel-phosphorus alloy, or a nickel-boron alloy, for example.

An individual external connection terminal 40 has a rod-like main body part and a tapered tip part at either end of the main body part. The main body part is shaped in a rectangular cylinder. The length of a diagonal line of a cross section of the individual external connection terminal 40 is longer than the diameter of the main body part of the individual contact part 30 by a few percent. Thus, an individual external connection terminal 40 is press-fittable into a corresponding contact part 30. In addition, the individual external connection terminal 40 is also made of metal material having excellent electrical conductivity. Examples of the metal material include silver, copper, nickel, and an alloy containing at least one kind of these elements. To improve the corrosion resistance, plating film may be formed on the surface of the individual external connection terminal 40 by plate processing. The plating film is made of nickel or an alloy containing nickel. For example, the alloy containing nickel is a nickel-phosphorus alloy or a nickel-boron alloy.

In addition, the solder that bonds the semiconductor chips 20 and 21 and the contact part 30 to the circuit plates 12 includes lead-free solder as its base substance. For example, the lead-free solder has at least one of an alloy of tin and silver, an alloy of tin and antimony, an alloy of tin and zinc, and an alloy of tin and copper as its primary component. The solder may contain an additive. The additive is, for example, copper, bismuth, indium, nickel, germanium, cobalt, or silicon. In addition, it is preferable that the composition of the solder bonding the semiconductor chips 20 and 21 be different from that of the solder bonding the contact parts 30. In this way, the solder bonding the semiconductor chips 20 and 21 has fewer voids and is highly tolerant to a high temperature. For example, such solder is an alloy containing tin and antimony as its primary components. The solder bonding the wiring terminals such as the contact parts 30 has a lower elastic modulus than that of the solder under the semiconductor chips 20 and 21. The solder under the contact parts 30 is, for example, an alloy containing tin and silver as its primary components. In addition, the solder bonding the semiconductor chips 20 and 21 may be thinner than the solder bonding the contact parts 30. The thickness of the solder under the semiconductor chips 20 and 21 is between 0.05 mm and 0.25 mm, inclusive. The thickness of the solder under the contact parts 30 is between 0.10 mm and 0.50 mm, inclusive. Since the solder under the semiconductor chips 20 and 21 has a higher elastic modulus than that of the solder under the contact parts 30, the solder under the semiconductor chips 20 and 21 may have a thinner thickness than that of the solder under the contact parts 30. Thus, the heat generated by the semiconductor chips 20 and 21 when the electronic device 50 is operated is released suitably. As described above, the solder under the contact parts 30 is thick. Thus, the solder under the contact parts 30 is able to withstand the stress that occurs when the external connection terminals 40 are inserted into the through-holes of the contact parts 30. Namely, for example, cracks in the solder and peeling of the solder are reduced. Therefore, breakage of the electronic device 50 is prevented.

For example, silicone gel may be used as the sealing material 45. In addition, for example, the sealing material 45 contains thermoset resin such as epoxy resin, phenol resin, or maleimide resin and filler contained in the thermoset resin. For example, the sealing material 45 contains epoxy resin and silicon dioxide, aluminum oxide, boron nitride, or aluminum nitride as the filler contained in the epoxy resin.

Figure 3:
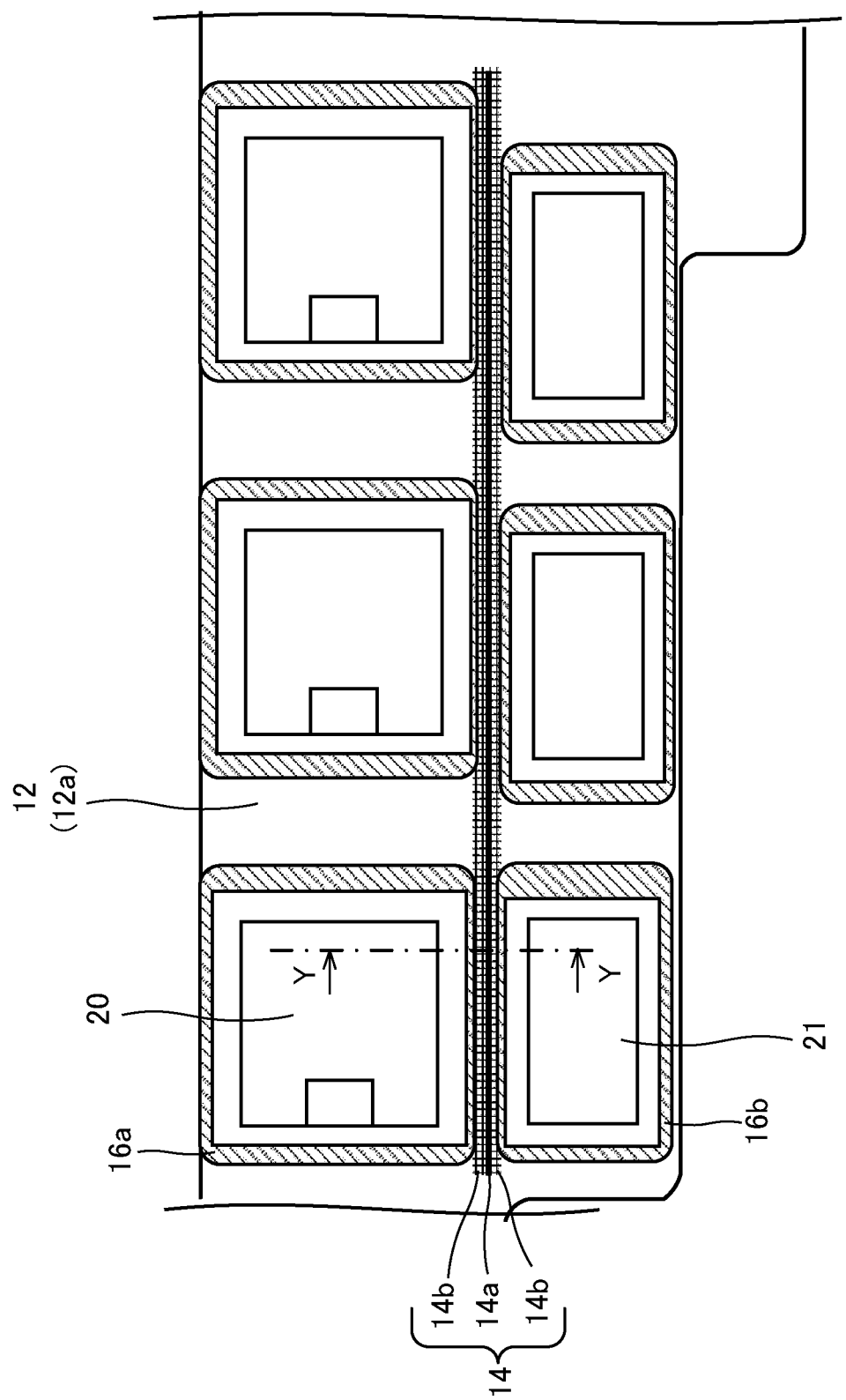
FIG. 3 is a plan view of a circuit plate included in the electronic device according to the embodiment.
Figure 4:
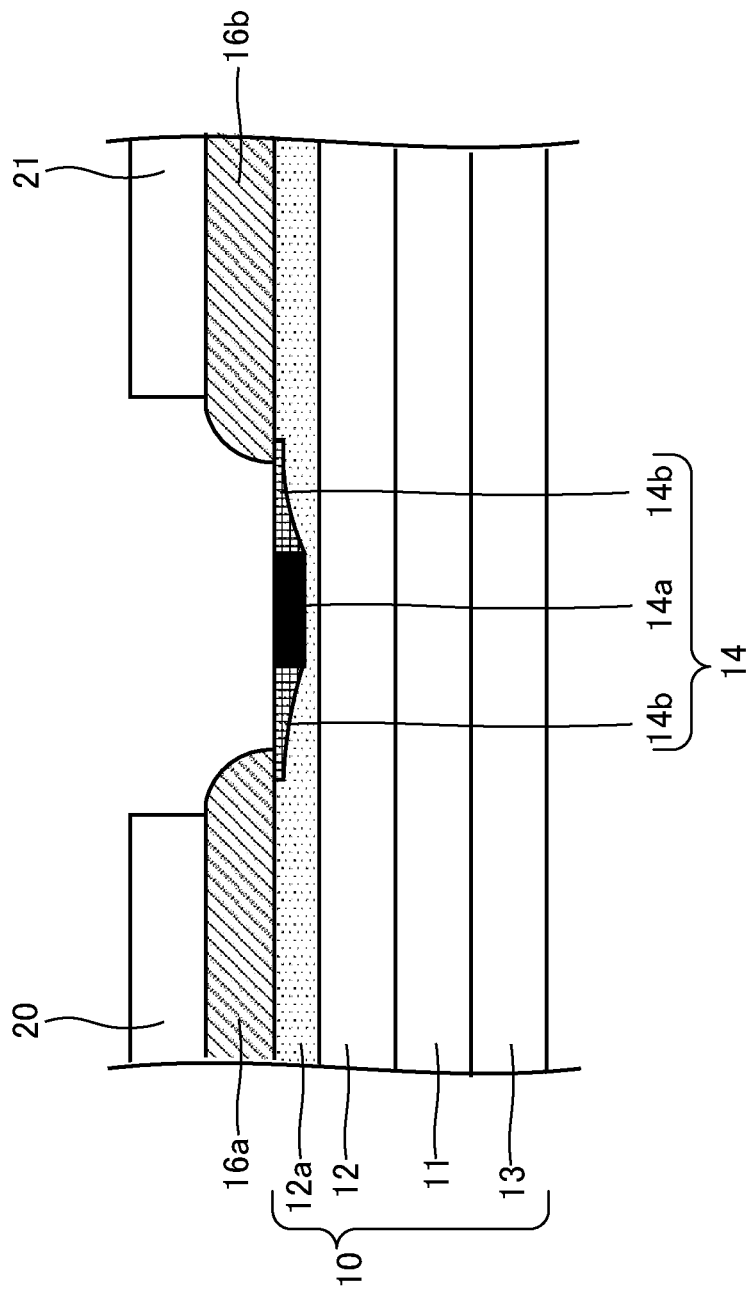
FIG. 4 is a sectional view of the circuit plate included in the electronic device according to the embodiment.

Next, a liquid-repellent part 14 formed on a circuit plate 12 will be described with reference to FIGS. 3 and 4. FIG. 3 is a plan view of a circuit plate 12 included in the electronic device 50 according to the embodiment. FIG. 4 is a sectional view of the circuit plate 12 included in the electronic device 50 according to the embodiment. FIG. 3 is an enlarged view of a dashed line area on a circuit plate 12 in FIG. 2. FIG. 4 is a sectional view taken along a dashed-dotted line Y-Y in FIG. 3. The plating film 12a formed on the front surface of the circuit plate 12 is illustrated in FIGS. 3 and 4.

The liquid-repellent part 14 illustrated in FIG. is linearly formed between an individual pair of semiconductor chips 20 and 21 on the plating film 12a. In FIG. 3, three pairs of semiconductor chips 20 and 21 are illustrated. The individual semiconductor chips 20 are disposed such that the long sides thereof are along the liquid-repellent part 14. These semiconductor chips 20 are disposed such that the short sides thereof along which their gate electrodes are disposed do not face the liquid-repellent part 14. When the long sides of the semiconductor chips 20 are along the liquid-repellent part 14, the locations of the ends of the solder are limited in a longer distance, compared with a case in which the short sides are along the liquid-repellent part 14. Thus, the locations of the semiconductor chips 20 are more stabilized. The semiconductor chips 20 may be disposed at any locations with consideration for the locations of wirings, as long as the sides along which their gate electrodes are disposed do not face the liquid-repellent part 14. The liquid-repellent part 14 repels solder. This liquid-repellent part 14 contains a resist region 14a and heat-affected regions 14b. The resist region 14a is oxide film such as nickel oxide film. The resist region 14a is formed by performing laser irradiation on the plating film 12a and oxidizing the plating film 12a. The laser irradiation may be performed by a seam laser in which laser light is continuously emitted or a spot laser in which pulsed laser light is emitted. FIG. 3 illustrates a case in which the laser irradiation is performed by a seam laser. Thus, the liquid-repellent part 14 in FIG. 3 is a linear laser mark in a planar view (a dotted mark if a spot laser is used). As will be described below, the liquid-repellent part 14 is formed by laser scanning with laser irradiation. In particular, the resist region 14a is formed by a plurality of laser marks formed in parallel with each other, each of the laser marks is formed per laser scanning. The plurality of laser marks are into contact with each other or partially overlap. It is preferable that the thickness of the resist region 14a (oxide film) formed in this way be 40 nm or more before solder bonding. In addition, it is preferable that the thickness of the resist region 14a (oxide film) be 25 nm or more after solder bonding. The reason why the solder bonding reduces the thickness of the resist region 14a (oxide film) could be attributable to a partial reduction of the oxide film by the flux included in the solder. The width of the resist region 14a may be 150 μm at minimum.

The individual heat-affected region 14b is oxide film formed along the resist region 14a. The individual heat-affected region 14b is formed at an area other than an area where the resist region 14a is formed in a plan view of the electronic device 50. As described above, to form the resist region 14a, laser scanning with laser irradiation is performed on the plating film 12a. In this operation, as the resist region 14a is formed, the plating film 12a on either side of the resist region 14a is affected by the heat of the laser. A heat-affected region 14b is consequently formed on either side of the resist region 14a. In addition, the width of the individual heat-affected region 14b widens as the output of the laser for forming the resist region 14a increases. In addition, as the width of the resist region 14a is widened, the widths of the heat-affected regions 14b are widened. However, when the width of the resist region 14a reaches a predetermined value, the widths of the heat-affected regions 14b become stable. A part of the individual heat-affected region 14b, the part being more distanced from the resist region 14a, is less affected by the heat of the laser, as illustrated in FIG. 4.

Regarding the individual liquid-repellent part 14 having the above configuration, the resist region 14a has higher liquid-repellent performance (liquid repellency) than that of the heat-affected regions 14b. That is, a liquid repellency of the resist region 14a is greater than a liquid repellency of the heat-affected region 14b. In addition, in the individual heat-affected region 14b, a liquid-repellent performance becomes higher as a position becomes closer to the resist region 14a. That is, in the heat-affected region 14b, the liquid repellency becomes greater as a position becomes closer to the resist region 14a. Thus, as illustrated in FIG. 4, while first and second solder 16a and 16b are spreadable to the outside of the liquid-repellent part 14, the first and second solder 16a and 16b are not spreadable to the center part, including the resist region 14a, of the liquid-repellent part 14. In addition, since the liquid-repellent part 14 is formed by laser irradiation, part of the plating film 12a remains under the liquid-repellent part 14. It is preferable that the total thickness of the liquid-repellent part 14 and the remaining part of the plating film 12a, i.e., a thickness from the front surface of the circuit plate 12 to a surface of the liquid-repellent region 14, which may correspond to a thickness of the plating film 12a, a surface of which is oxidized, is 6 μm or more be 6 μm or more. It is preferable that the thickness of the remaining part of the plating film 12a under the liquid-repellent part 14 be 5 μm or more.

FIG. 3 illustrates an example of how a liquid-repellent part 14 is formed for semiconductor chips 20 and 21. The resist region 14a of the individual liquid-repellent part is formed on the plating film 12a under the following conditions. First, it is preferable that the resist region 14a be separated from the semiconductor chips 20 and 21 by at least 0.3 mm. In addition, it is preferable that the resist region 14a be separated from an end of the corresponding circuit plate 12 by 0.5 mm or more. It is preferable that the width of the resist region 14a be set between 0.4 mm and 0.5 mm, inclusive. When it is difficult to separate the resist region 14a from the semiconductor chips 20 and 21 by 0.3 mm or more or from an end of the corresponding circuit plate 12 by 0.5 mm or more, it is preferable that the width of the resist region 14a be set 0.15 mm or more. In addition, when an end of the resist region 14a is separated from an end of the corresponding circuit plate 12 by 0.5 mm or more, it is preferable that the length of the resist region 14a be extended such that the end of the resist region 14a is beyond end surfaces of the semiconductor chips 20 and 21 by a maximum of 1.0 mm. In addition, it is preferable that the resist region 14a be separated from a contact part 30 by 0.3 mm or more. When it is difficult to separate the resist region 14a from a contact part 30 by 0.3 mm or more, it is preferable that the width of the resist region 14a be set between 0.1 mm and 0.2 mm, inclusive.

Figure 5:
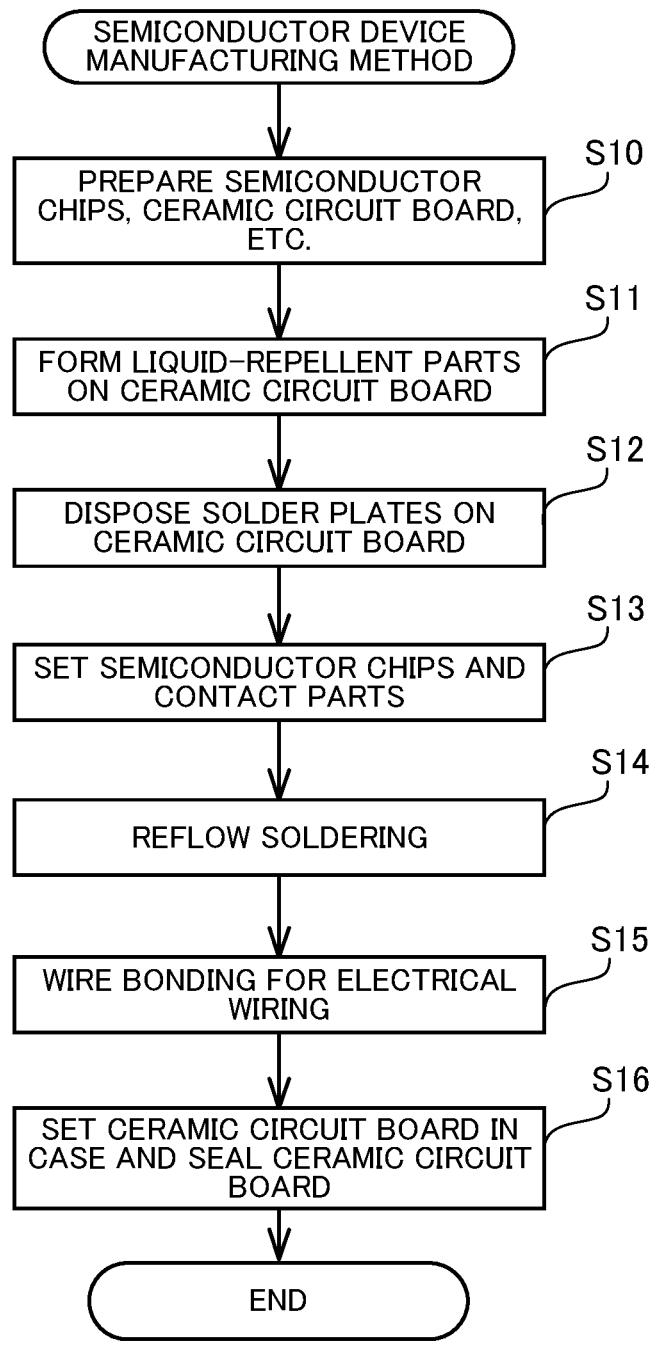
FIG. 5 is a flowchart illustrating an electronic device manufacturing method according to the embodiment.
Figure 6:
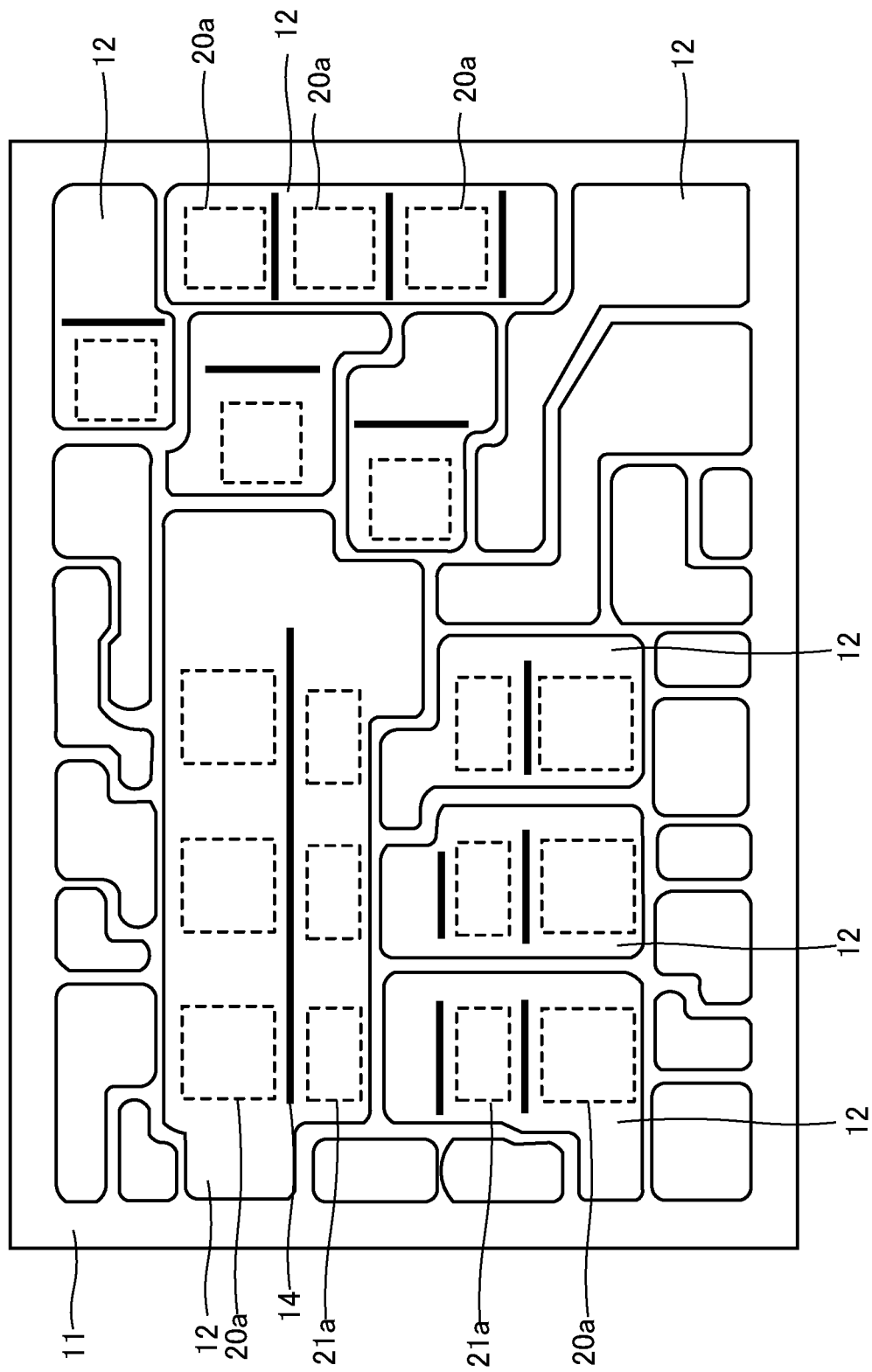
FIG. 6 is a plan view of a ceramic circuit board included in the electronic device according to the embodiment.
Figure 7:
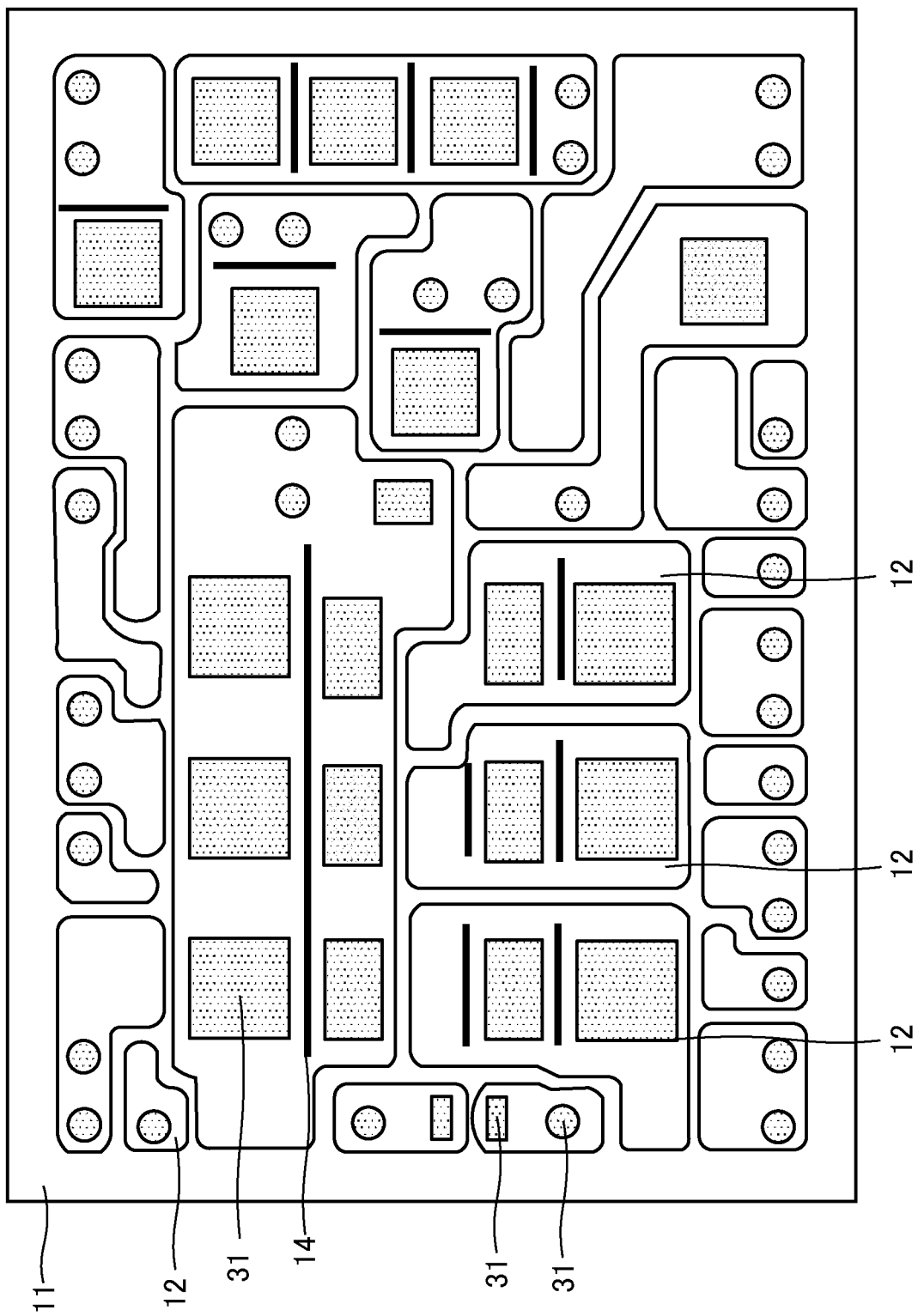
FIG. 7 is a plan view illustrating a solder application step in the electronic device manufacturing method according to the embodiment.
Figure 8:
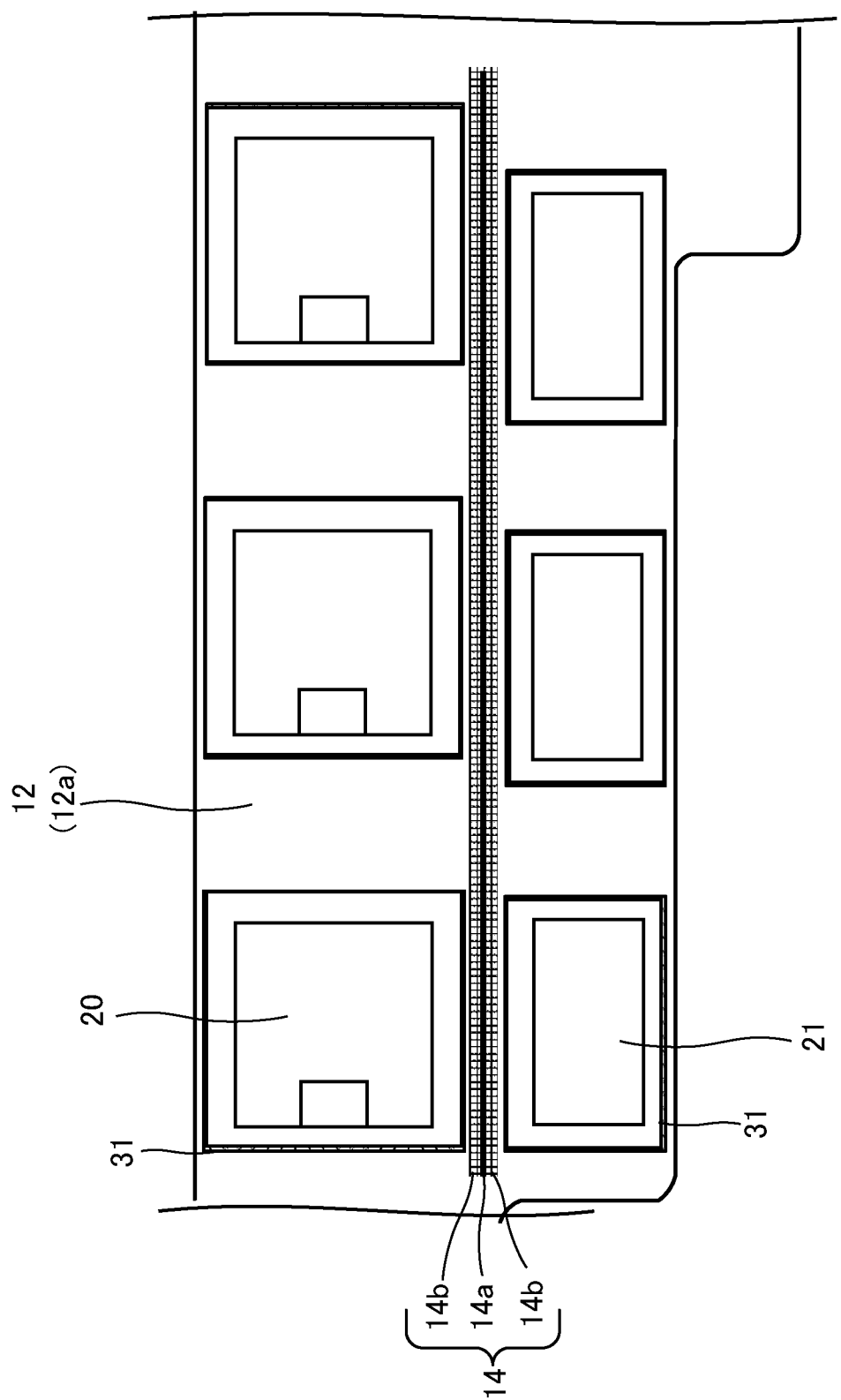
FIG. 8 is a plan view illustrating a reflow soldering step in the electronic device manufacturing method according to the embodiment.
Figure 9:
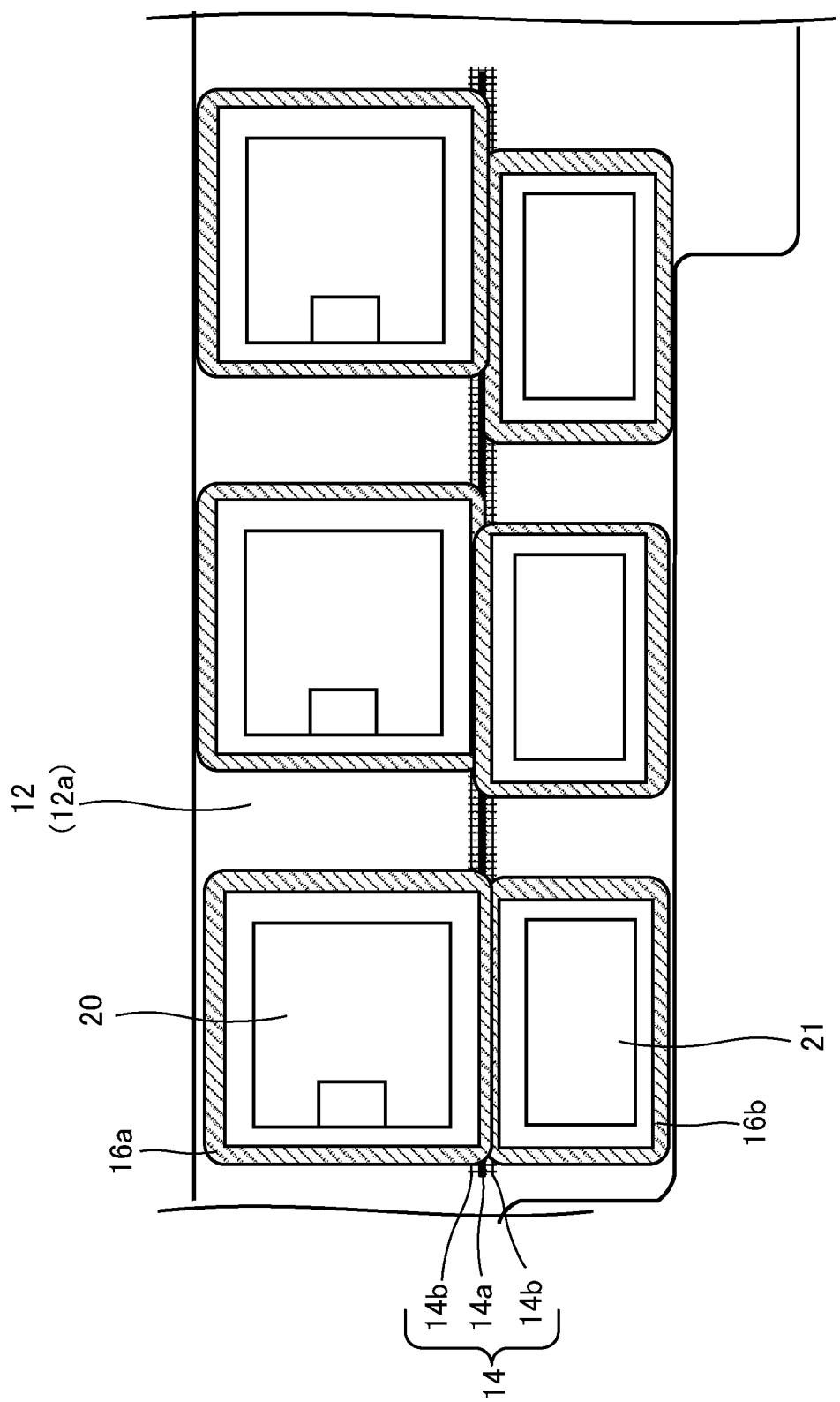
FIG. 9 is another plan view illustrating the reflow soldering step in the electronic device manufacturing method according to the embodiment.
Figure 10:
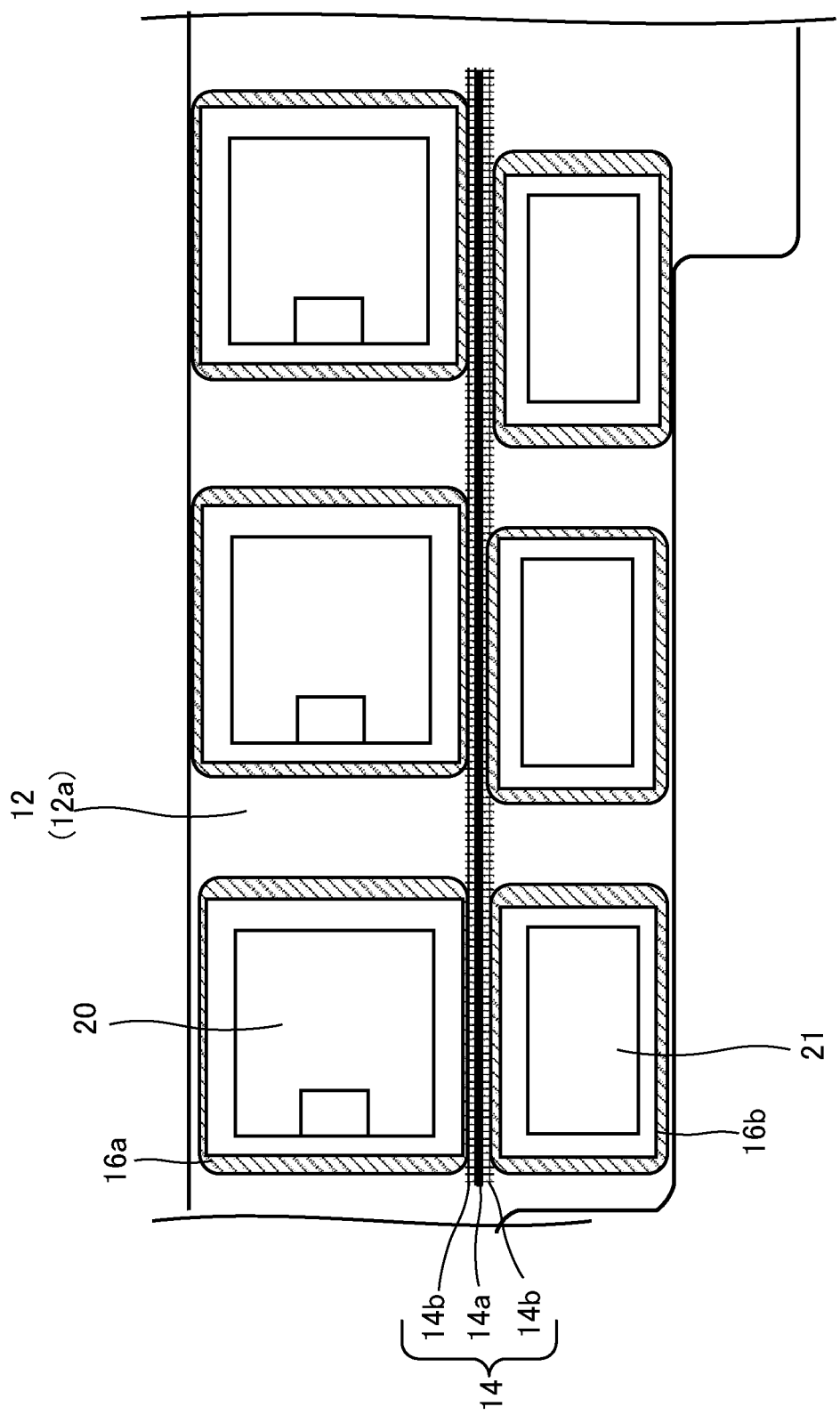
FIG. 10 is still another plan view illustrating the reflow soldering step in the electronic device manufacturing method according to the embodiment.

Next, a method for manufacturing the electronic device 50 will be described with reference to FIG. 5 illustrating a flowchart and FIGS. 6 to 10 illustrating steps in the flowchart. FIG. 5 is a flowchart illustrating an electronic device manufacturing method according to the embodiment. FIG. 6 is a plan view of the ceramic circuit board included in the electronic device 50 according to the embodiment. FIG. 7 is a plan view illustrating a solder application step in the electronic device manufacturing method according to the embodiment. FIGS. 8 to 10 are each a plan view illustrating a reflow soldering step in the electronic device manufacturing method according to the embodiment. The plan views in FIGS. 8 to 10 correspond to the plan view in FIG. 3.

The electronic device 50 is manufactured in accordance with the following manufacturing steps (flowchart). The following manufacturing steps are performed manually or by a manufacturing apparatus, depending on the need.

[Step S10] The semiconductor chips 20 and 21, the ceramic circuit board 10, and the contact parts 30 are prepared. Other parts that are needed for manufacturing the electronic device 50 are also prepared. The ceramic circuit board 10 includes the insulating plate 11, the plurality of circuit plates 12 (see FIG. 6) formed on the front surface of the insulating plate 11, and the metal plate 13 formed on the rear surface of the insulating plate 11. In FIG. 6, rectangular dashed lines on the plurality of circuit plates 12 represent part regions 20a and 21a where the semiconductor chips 20 and 21 are to be disposed. In addition, while not illustrated in FIG. 6, the plating film 12a has been formed on the front surfaces of the circuit plates 12 by plate processing.

[Step S11] As illustrated in FIG. 6, the liquid-repellent parts 14 are formed on the circuit plates 12 of the ceramic circuit board 10 by laser irradiation. The laser irradiation is performed by a YAG laser or a YVO$_4$ laser, for example. Such a laser apparatus is used to repeat laser scanning with a seam laser or a spot laser on predetermined areas, and the resist regions 14a are consequently formed. The predetermined areas are, for example, an area between where a semiconductor chip 20 is disposed and where a semiconductor chip 21 is disposed and an area between where a semiconductor chip 20 or 21 is disposed and where a contact part 30 is disposed (see FIG. 2). As needed, a resist region 14a may be formed in an area between where a contact part 30 is disposed and where another contact part 30 is disposed. The width of an individual resist region 14a is suitably controllable based on the number of laser scanning operations. The width of the resist region 14a illustrated in FIG. 3 is only an example. The width of the individual resist region 14a illustrated in FIG. 3 may be increased or decreased by increasing or decreasing the number of laser scanning operations. The laser irradiation is suitably settable under the conditions that the scanning speed is 1000 mm/sec, the scanning intervals are 40 μm, the variable spot size is between −10 and 10, inclusive, and the pulse frequency is between 25 kHz and 60 kHz, inclusive. In this step, the laser irradiation is performed to oxidize the plating film 12a on the surfaces of the corresponding circuit plates 12, and the laser scanning and the output of the laser are set such that the base parts of the circuit plates 12 are not exposed. As a resist region 14a is formed, a heat-affected region 14b is formed on either side of the resist region 14a along the resist region 14a. Each heat-affected region 14b formed in this way has a width of 50 μm or more, for example.

[Step S12] As illustrated in FIG. 7, a solder plate 31 is disposed on each of the part regions 20a and 21a of the semiconductor chips 20 and 21 and each of the installation areas of the contact parts 30 on the circuit plates 12 of the ceramic circuit board 10. In place of these solder plates 31, solder may be applied to the circuit plates 12 of the ceramic circuit board 10 by a dispenser, for example. In FIG. 7, the solder plates 31 corresponding to the semiconductor chips 20 and 21 are denoted by rectangles, and the solder plates 31 corresponding to the contact parts 30 are denoted by circles.

All the solder plates 31 in the present example are made of the same material. For example, the individual solder plate 31 is made of lead-free solder containing, as its primary component, at least one of an alloy of tin, silver, and copper, an alloy of tin, zinc, and bismuth, an alloy of tin and copper, and an alloy of tin, silver, indium, and bismuth. In addition to this, the lead-free solder contains flux that removes oxide on the circuit plates 12 (plating film 12a). The flux contains, for example, epoxy resin, carboxylic acid, rosin resin, activator, or solvent. As needed, the flux may contain other components. In addition, the solder plate 31 may contain an additive such as nickel, germanium, cobalt, or silicon.

[Step S13] A mounting apparatus (not illustrated) is operated to set the semiconductor chips 20 and 21 and the contact parts 30 on the solder plates 31 disposed in step S12. In this step, the electronic part 22 is also set.

[Step S14] After the semiconductor chips 20 and 21 and the contact parts 30 are set on the circuit plates 12 of the ceramic circuit board 10 via the solder plates 31 in step S13, the ceramic circuit board 10 is conveyed into a reflow oven. The semiconductor chips 20 and 21 are mounted on the solder plates 31 on the circuit plates 12 (plating film 12a), as illustrated in FIG. 8, for example. In this state, the oven is depressurized and heated at a reflow process temperature (reflow soldering step). The reflow process temperature is, for example, between 250° C. and 300° C., inclusive. As a result, the solder plates 31 between the plating film 12a and the semiconductor chips 20 and 21 are melted. The first and second solder 16a and 16b obtained as a result of the melting of the solder plates 31 spread to the outside of the semiconductor chips 20 and 21, as illustrated in FIG. 9. At this point, the semiconductor chips 20 and 21 could move on the spread first and second solder 16a and 16b. In addition, the spread first and second solder 16a and 16b also spread onto the liquid-repellent part 14. In some cases, the first and second solder 16a and 16b could be bonded to each other on the liquid-repellent part 14. Subsequently, the first and second solder 16a and 16b on the liquid-repellent part 14 are repelled by the liquid-repellent part due to the liquid-repellent property of the liquid-repellent part 14 and are separated from each other by a predetermined gap. Accordingly, as illustrated in FIG. 10, the semiconductor chips 20 and 21, which have been displaced on the spread first and second solder 16a and 16b, return to their predetermined locations. Next, the melted first and second solder 16a and 16b are solidified, and the semiconductor chips 20 and 21 are bonded to the circuit plates 12 (plating film 12a) by the first and second solder 16a and 16b solidified (see FIG. 4). The contact parts 30 are also bonded to the circuit plates 12 (plating film 12a) by solder in the same manner.

[Step S15] The ceramic circuit board 10 including the circuit plates 12 to which the semiconductor chips 20 and and the contact parts 30 have been bonded is extracted from the reflow oven. Next, an ultrasonic bonding tool (not illustrated) is used to electrically connect predetermined areas of the individual circuit plates 12 of the ceramic circuit board 10 and the semiconductor chips 20 and 21 via the bonding wires 15. In addition, after the bonding wires 15 are connected as described above, the external connection terminals (not illustrated) are pressed into the contact parts 30.

[Step S16] After the semiconductor chips 20 and 21 and the contact parts 30 are bonded to the circuit plates and are electrically connected to the circuit plates 12 via the bonding wires 15, the ceramic circuit board 10 is set in a case and sealed with the sealing material 45. Thus, the electronic device 50 illustrated in FIGS. 1 and 2 is manufactured.

Figure 11:
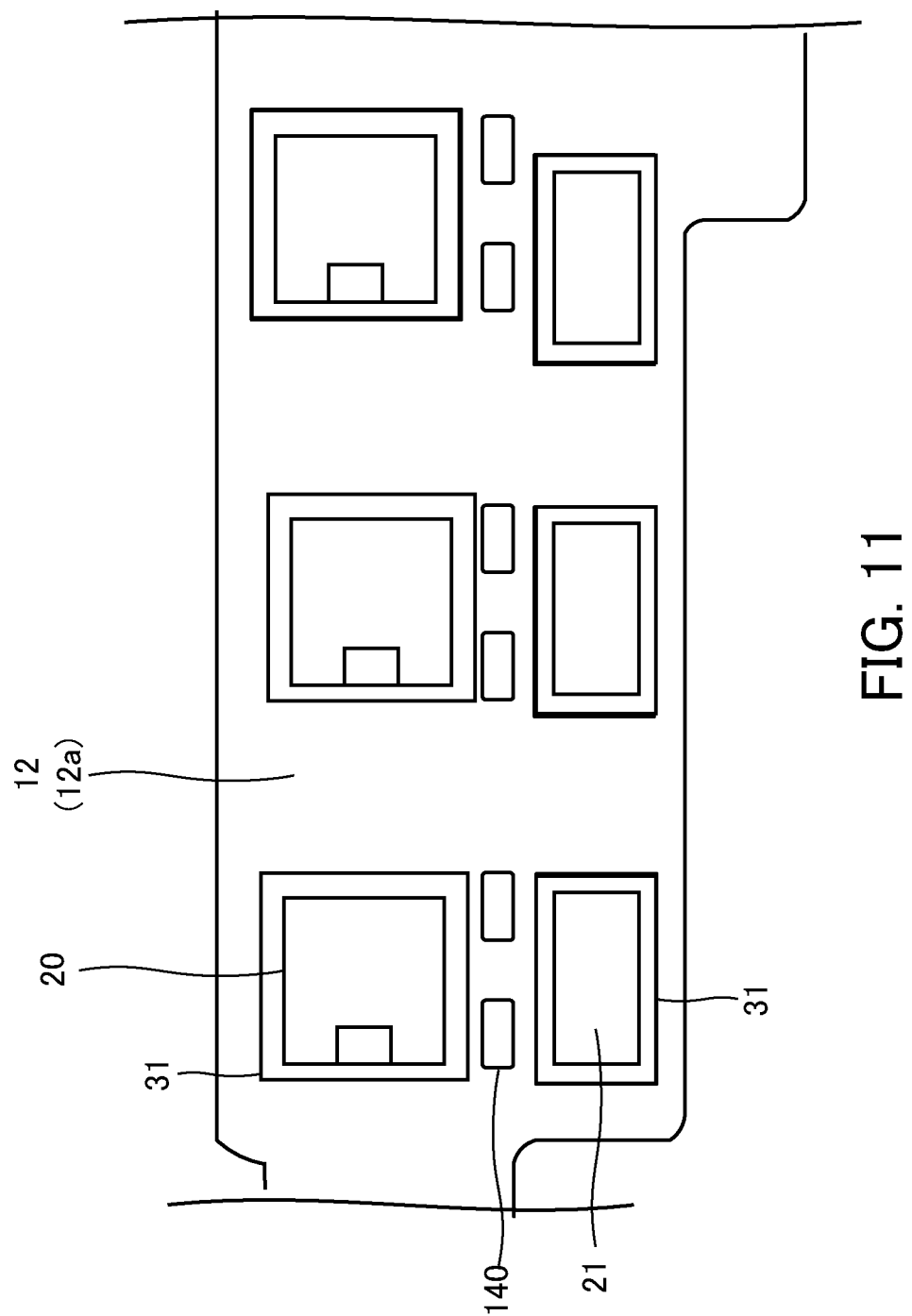
FIG. 11 is a plan view illustrating a reflow soldering step in an electronic device manufacturing method according to a reference example.
Figure 12:
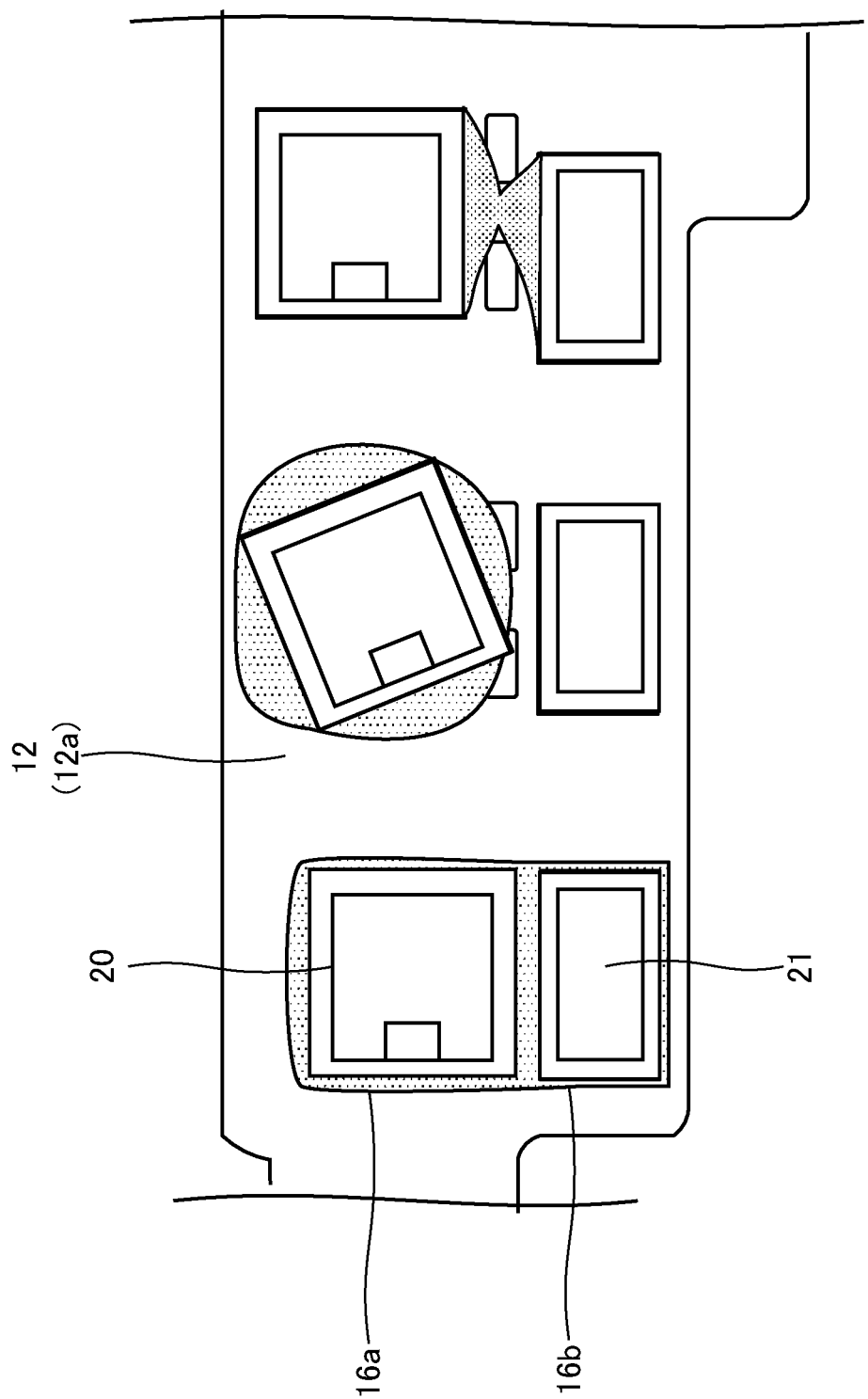
FIG. 12 is another plan view illustrating the reflow soldering step in the electronic device manufacturing method according to the reference example.

Next, a case in which the liquid-repellent parts 14 are not formed on the circuit plates 12 will be described with reference to FIGS. 11 and 12. In this case, slits 140 are formed instead where the above liquid-repellent parts 14 are formed, and the above reflow soldering in step S14 is performed. Each of FIGS. 11 and 12 is a plan view illustrating a reflow soldering step in an electronic device manufacturing method according to a reference example. The electronic device according to the reference example has the same structure as that of the electronic device 50, other than the slits 140 formed in place of the liquid-repellent parts 14. Thus, like reference characters denote like elements, and description thereof will be omitted. In addition, FIGS. 11 and 12 illustrate the states corresponding to those illustrated in FIGS. 8 and 10.

The slits 140 are formed in the circuit plates 12 (plating film 12a) of the ceramic circuit board 10, and the semiconductor chips 20 and 21 are disposed on the circuit plates 12 (plating film 12a) via the solder plates 31. Next, the ceramic circuit board 10 is conveyed into a reflow oven (see FIG. 11). The slits 140 are concave grooves formed in the circuit plates 12 (plating film 12a). In this state, the oven is depressurized and heated at a reflow process temperature. As a result, the solder plates 31 between the plating film 12a and the semiconductor chips 20 and 21 are melted. After the solder plates 31 are melted, the resultant first and second solder 16a and 16b spread to the outside of the semiconductor chips 20 and 21. Thus, for example, the semiconductor chip 20 (in the middle in FIG. 12) on the circuit plate 12 is rotated at the spot or shifted by the spread first solder 16a. A part of the rotated semiconductor chip 20 is located on a slit 140 via the first solder 16a. When these slits 140 are filled with the first solder 16a, voids could occur in the slits 140. If voids occur as described above, the heat radiation performance for the semiconductor chip 20 is deteriorated. This could also happen to the semiconductor chips 21.

In addition, the first and second solder 16a and 16b are bonded to each other on the circuit plate 12 (on the left and right sides in FIG. 12). In these cases, the semiconductor chips 20 and 21 are electrically connected, which could result in an electrical failure of the electronic device 50.

Thus, the above electronic device 50 includes the semiconductor chips 20 and 21, which are parts, and the circuit plates 12 whose front surfaces are covered by the plating film 12a and whose front surfaces have predetermined part regions on which the semiconductor chips 20 and 21 are disposed via the first and second solder 16a and 16. In the case of the electronic device 50, the individual liquid-repellent part 14 is formed along a side of the part region of the corresponding plating film 12a and includes oxide film formed by oxidizing the plating film 12a on the front surface, part of the plating film 12a remaining under the oxide film. In this way, since the first and second solder 16a and 16b are repelled by the liquid-repellent part 14, spreading of the first and second solder 16a and 16b is prevented by the liquid-repellent part 14. In addition, since the individual liquid-repellent part 14 is formed by laser irradiation, forming the liquid-repellent part 14 is possible even in a narrow area. Thus, it is possible to form the semiconductor chips 20 and 21 with a small gap therebetween and form the liquid-repellent part 14 in the gap, and spreading of the first and second solder 16a and 16b is prevented. In addition, slits for preventing the spreading of the first and second solder 16a and 16b do not need to be formed in the circuit plates 12. Thus, deterioration of the flexural strength of the circuit plates 12 is prevented. Therefore, it is possible to mount the semiconductor chips 20 and 21 densely without causing electrical failures. In addition, it is possible to prevent deterioration of the strength of the electronic device 50 and deterioration of the reliability of the electronic device 50.

Next, various examples of the liquid-repellent parts 14 formed on the circuit plates (plating film) on which the semiconductor chips are disposed will be described with reference to FIGS. 13A to 13C and FIGS. 14A to 14C. FIGS. 13A and 13C and FIGS. 14A to 14C are each a plan view illustrating an example of liquid-repellent parts formed on the ceramic circuit board of the electronic device according to the embodiment. In FIGS. 13A to 13C and FIGS. 14A to 14C, the plating film 12a is formed on the front surface of a circuit plate 12. FIGS. 13A to 13C and FIGS. 14A to 14C each illustrate an example in which semiconductor chips 23a to 23d are bonded to the plating film 12a via solder (not illustrated). In addition, FIGS. 13A to 13C and FIGS. 14A to 14C each illustrate an example in which the semiconductor chips 23a to 23d are disposed on a circuit plate 12 (plating film 12a) in two rows and two columns.

Figure 13C:
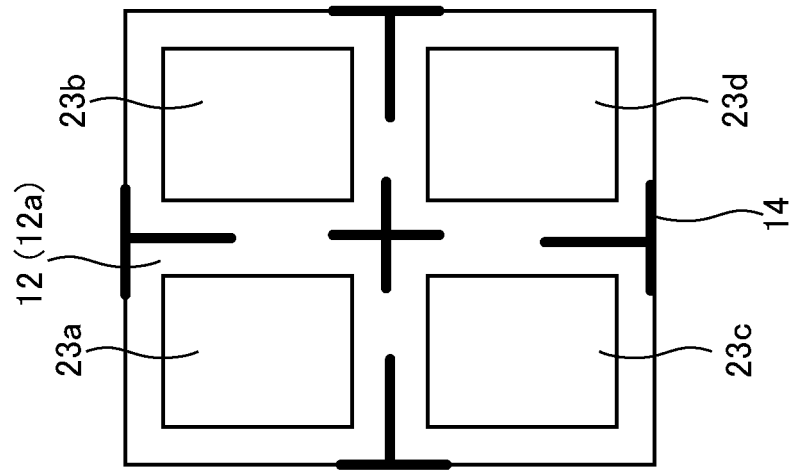
FIGS. 13A to 13C are plan views illustrating examples of liquid-repellent parts formed on the ceramic circuit board included in the electronic device according to the embodiment.
Figure 13B:
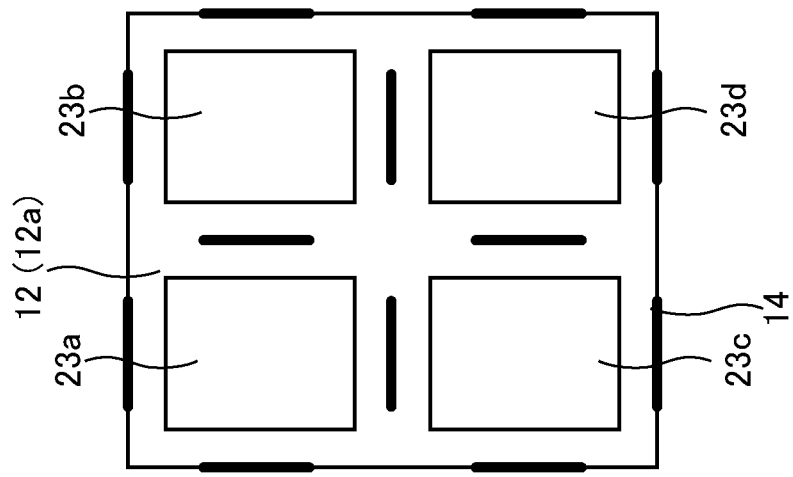
Figure 13A:
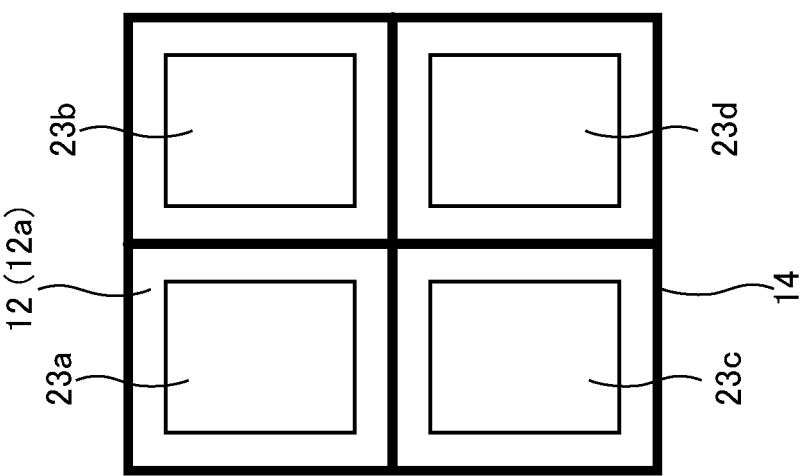

In FIG. 13A, a liquid-repellent part 14 is formed continuously (in a cross shape) among the semiconductor chips 23a to 23d. A liquid-repellent part 14 is also formed around the semiconductor chips 23a to 23d. The liquid-repellent part 14 may be formed continuously (in a cross shape) only among the semiconductor chips 23a to 23d. In FIG. 13B, the liquid-repellent parts 14 in FIG. 13A are formed intermittently. The intermittent liquid-repellent parts 14 in FIG. 13B are only an example. By narrowing the intervals and forming more liquid-repellent parts 14, the liquid-repellent parts 14 may be formed in dotted lines. In FIG. 13C, the liquid-repellent parts 14 in FIG. 13A are formed intermittently. However, in FIG. 13C, only of the intersections of the liquid-repellent parts 14 are left.

Figure 14C:
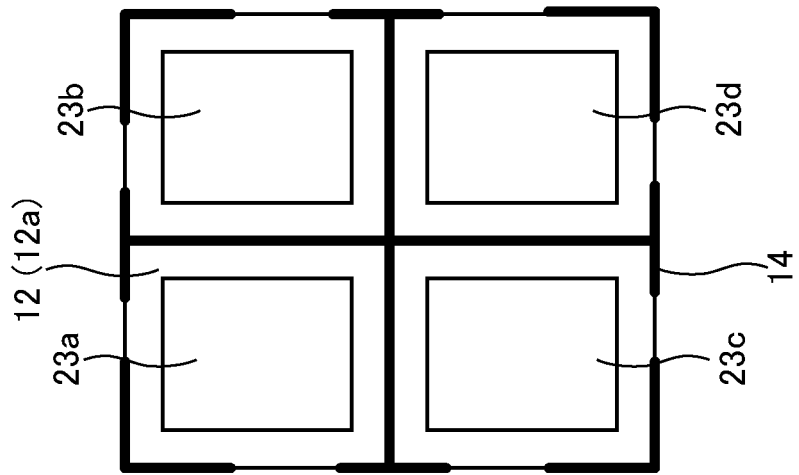
FIGS. 14A to 14C are other plan views illustrating other examples of liquid-repellent parts formed on the ceramic circuit board included in the electronic device according to the embodiment.
Figure 14B:
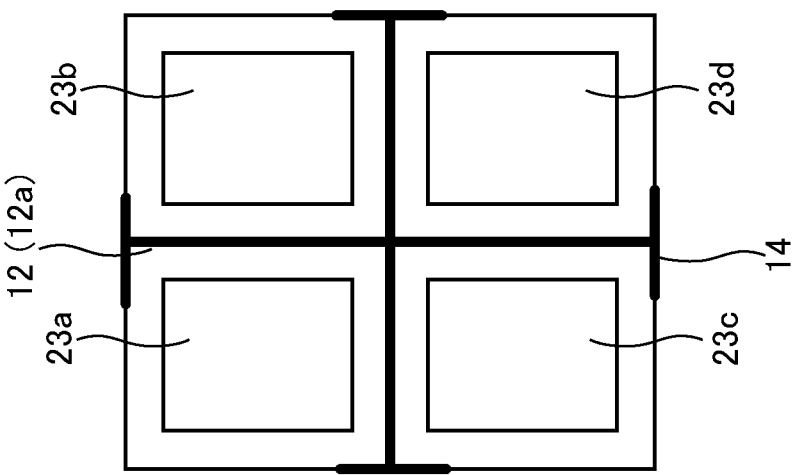
Figure 14A:
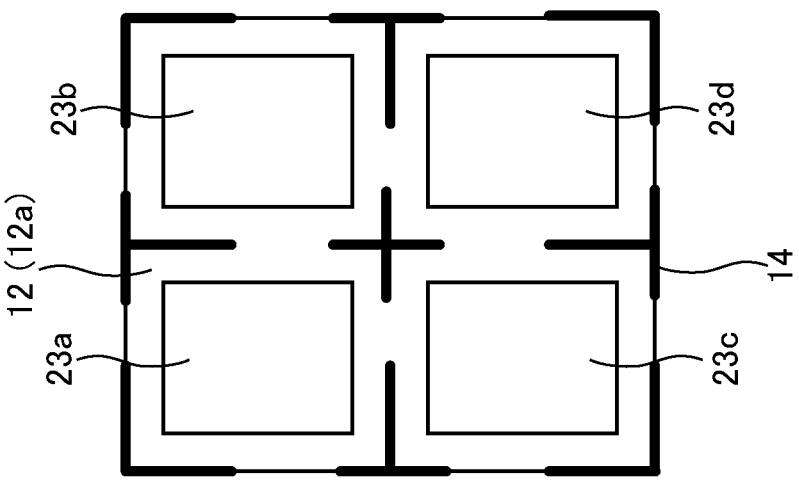

In FIG. 14A, in addition to the liquid-repellent parts 14 in FIG. 13C, a liquid-repellent part 14 is formed on each of the four corners of the area surrounding the semiconductor chips 23a to 23d. In FIG. 14B, while the liquid-repellent parts 14 are similar to those in FIG. 13C, the liquid-repellent parts 14 at the boundary between any two of the semiconductor chips 23a to 23d are formed to be connected to each other. In FIG. 14C, in addition to the liquid-repellent parts 14 in FIG. 14B, a liquid-repellent part 14 is formed on each of the four corners of the area surrounding the semiconductor chips 23a to 23d.

By forming the liquid-repellent parts 14 as described above, spreading of the solder under the semiconductor chips 23a to 23d is prevented, and the semiconductor chips 23a to 23d are disposed as close as possible to each other. The width of the individual liquid-repellent part 14 in FIGS. 13A to 13C and FIGS. 14A to 14C is suitably settable, depending on the need. In addition, FIGS. 13A to 13C and FIGS. 14A to 14C are only examples, and the liquid-repellent parts 14 may suitably be formed on the plating film 12a for the semiconductor chips, etc.

The disclosed embodiment provides an electronic device including a board on which parts are densely mounted without causing electrical failures and without deteriorating the reliability of the electronic device. The disclosed embodiment also provides a manufacturing method of the electronic device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An electronic apparatus, comprising:
    a first part; and
    a circuit plate including
        a circuit substrate having a front surface,
        a plating film made of a plating material, and being disposed on the front surface of the circuit substrate, the plating film having a first surface and a second surface opposite to the first surface and facing the front surface of the circuit substrate, the plating film including a first part region at its first surface, the first part being disposed on the first part region via a first solder, and
    a liquid-repellent region disposed to extend in an extending direction along a periphery side of the first part region in a surface layer of the plating film at a first surface side thereof, and having a liquid repellency greater than a liquid repellency of the plating film, the liquid-repellent region including a resist region, wherein
    the plating film includes a remaining portion between the liquid-repellent region and the front surface of the circuit substrate in a thickness direction of the plating film orthogonal to the front surface of the circuit substrate, the remaining portion being made of the plating material and being free of any oxidized plating material.

2. The electronic apparatus according to claim 1, wherein the liquid-repellent region further includes a heat-affected region having a liquid repellency smaller than the liquid repellency of the resist region, the heat-affected region being disposed so as to extend in an extending direction along either one or both sides of the resist region along the periphery side of the first part region.

3. The electronic apparatus according to claim 2, wherein a width of the one or each of the both sides of the heat-affected region in a direction orthogonal to the extending direction of the heat-affected region is 50 μm or more.

4. The electronic apparatus according to claim 1, wherein a thickness of the resist region in the thickness direction of the plating film is 25 nm or more.

5. The electronic apparatus according to claim 1, wherein a width of the resist region in a direction orthogonal to the extending direction of the liquid-repellent region is not less than 100 μm and not more than 500 μm.

6. The electronic apparatus according to claim 1, wherein a distance between the first part and the resist region in a direction parallel to the front surface of the circuit substrate is less than 300 μm.

7. The electronic apparatus according to claim 6, wherein a width of the resist region in a direction orthogonal to the extending direction of the liquid-repellent region is not less than 100 μm and not more than 200 μm.

8. The electronic apparatus according to claim 1, wherein a total thickness of the liquid-repellent region and the remaining portion of the plating film in the thickness direction of the plating film is 6 μm or more.

9. The electronic apparatus according to claim 1, wherein a thickness of the remaining portion from the front surface of the circuit substrate to a bottom of the liquid-repellent region in the thickness direction of the plating film is 5 μm or more.

10. The electronic apparatus according to claim 1, wherein the circuit substrate is made of copper or a copper alloy, and the plating material is nickel or a nickel alloy.

11. The electronic apparatus according to claim 1, wherein the liquid-repellent region has a straight line shape or a dotted line shape in a plan view of the electronic apparatus.

12. The electronic apparatus according to claim 11, wherein the resist region of the liquid-repellent region includes a first laser mark of a laser light.

13. The electronic apparatus according to claim 12, wherein the resist region includes
    the first laser mark and a second laser mark, both extending in an extending direction of the liquid-repellent region along the periphery side of the first part region of the circuit substrate, the second laser mark being in direct contact with the first laser mark or partially overlapping the first laser mark.

14. The electronic apparatus according to claim 13, wherein the first part is a semiconductor chip having a rectangular shape with four sides in a plan view of the electronic apparatus, one of the four sides of the semiconductor chip being disposed to be parallel to the periphery side of the first part region of the circuit substrate.

15. The electronic apparatus according to claim 14, wherein the semiconductor chip includes a control electrode disposed on a front surface thereof, the control electrode being disposed at an other side among the four sides of the semiconductor ship, said other side being orthogonal to said one side.

16. The electronic apparatus according to claim 1, further comprising a second part, wherein the plating film further includes a second part region adjacent to the first part region at the first surface of the plating film, the second part being disposed on the second part region via a second solder, and
    the liquid-repellent region is disposed between the first part region and the second part.

17. The electronic apparatus according to claim 1, wherein the plating film is formed on an entire area of the front surface of the circuit substrate that has a periphery side that is parallel to the periphery side of the first part region, the liquid-repellent region being disposed between the periphery side of the circuit substrate and the periphery side of the first part region.

18. The electronic apparatus according to claim 1, further comprising a third part, wherein the first part is a semiconductor chip, and the third part is a conductive member to which an external terminal is electrically connected, the plating film further includes a third part region adjacent to the first part region at the first surface of the plating film, the third part being disposed on the third part region, and the liquid-repellent region is disposed between the first part region and the third part region.

19. An electronic apparatus manufacturing method comprising:

preparing a first part, and a circuit plate having a circuit substrate and a plating film made of a metal material formed on the circuit substrate and having a first part region to which the first part is to be disposed;

forming a liquid-repellent region at an area adjacent to the first part region of the plating film, by irradiating laser light onto the plating film, thereby to oxidize the metal material only at a surface layer of the plating film, so as to leave the metal material between the circuit substrate and the liquid-repellent region unoxidized;

disposing a first solder on the first part region of the plating film;

disposing the first part on the first solder in the first part region; and melting the first solder to connect the first part to the circuit plate.

20. The electronic apparatus manufacturing method according to claim 19, wherein a thickness of the surface layer of the plating film that is oxidized by the laser light is 40 nm or more.

* * * * *